(12) United States Patent
Srinivasan et al.

(10) Patent No.: US 9,245,645 B2
(45) Date of Patent: Jan. 26, 2016

(54) MULTI-PULSE PROGRAMMING FOR MEMORY

(71) Applicant: INTEL CORPORATION, Santa Clara, CA (US)

(72) Inventors: Charan Srinivasan, Redwood City, CA (US); Pranav Kalavade, San Jose, CA (US); Shyam Sunder Raghunathan, Sunnyvale, CA (US); Krishna K. Parat, Palo Alto, CA (US)

(73) Assignee: INTEL CORPORATION, Santa Clara, CA (US)

( * ) Notice: Subject to any disclaimer, the term of this patent is extended or adjusted under 35 U.S.C. 154(b) by 137 days.

(21) Appl. No.: 13/963,629

(22) Filed: Aug. 9, 2013

(65) Prior Publication Data

US 2015/0043275 A1    Feb. 12, 2015

(51) Int. Cl.
*G11C 16/04* (2006.01)
*G11C 16/34* (2006.01)
*G11C 16/10* (2006.01)
*G11C 11/56* (2006.01)

(52) U.S. Cl.
CPC ........ *G11C 16/3459* (2013.01); *G11C 11/5628* (2013.01); *G11C 16/10* (2013.01); *G11C 16/3418* (2013.01); *G11C 16/3427* (2013.01); *G11C 2211/5621* (2013.01)

(58) Field of Classification Search
CPC ............... G11C 16/10; G11C 11/5628; G11C 16/3418; G11C 16/3427; G11C 16/3459; G11C 2211/5621
USPC ........................... 365/185.19, 185.17, 185.24
See application file for complete search history.

(56) References Cited

U.S. PATENT DOCUMENTS

| | | | | |
|---|---|---|---|---|
| 7,633,802 | B2 * | 12/2009 | Mokhlesi | G11C 11/5628 365/185.18 |
| 7,764,542 | B2 * | 7/2010 | Edahiro et al. | 365/185.03 |
| 8,773,902 | B2 * | 7/2014 | Dutta et al. | 365/185.02 |
| 2008/0253181 | A1 * | 10/2008 | Edahiro et al. | 365/185.03 |
| 2009/0103356 | A1 * | 4/2009 | Mokhlesi | G11C 11/5628 365/185.02 |
| 2011/0103151 | A1 * | 5/2011 | Kim et al. | 365/185.19 |
| 2013/0301351 | A1 * | 11/2013 | Dutta et al. | 365/185.02 |

* cited by examiner

*Primary Examiner* — Richard Elms
*Assistant Examiner* — Xiaochun L Chen
(74) *Attorney, Agent, or Firm* — Schwabe Williamson & Wyatt PC

(57) ABSTRACT

Embodiments of the present disclosure include techniques and configurations for multi-pulse programming of a memory device. In one embodiment, a method includes applying multiple pulses to program one or more multi-level cells (MLCs) of a memory device, wherein individual pulses of the multiple pulses correspond with individual levels of the one or more MLCs and subsequent to applying the multiple pulses, verifying the programming of the individual levels of the one or more MLCs. Other embodiments may be described and/or claimed.

16 Claims, 4 Drawing Sheets

MULTI-PULSE PROGRAMMING FOR MEMORY

FIELD

Embodiments of the present disclosure generally relate to the field of integrated circuits, and more particularly, to techniques and configurations for multi-pulse programming of a memory device.

BACKGROUND

Presently, a memory device such as, for example, multi-level cell (MLC) flash memory may include individual multi-level cells (MLCs) that may be programmed to multiple voltage levels. For example, a 2-bit per cell NAND device may include cells that start at an erased voltage level (L0) and may be programmed to one of three program voltage levels (L1, L2 or L3). Such programming may occur in a series of loops where each loop includes only a single program pulse. A programming time for the MLCs may correspond with a number of loops and operations (e.g., program, verify, etc.) performed during the loops. The ongoing demand for faster operation of memory may drive reduction of the programming time in MLC memory devices.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Embodiments of the present disclosure include techniques and configurations for multi-pulse programming of a memory device. In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Various operations are described as multiple discrete operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous. The term "coupled" may refer to a direct connection, an indirect connection, or an indirect communication.

As used herein, the term "module" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, state machine and/or other suitable components that provide the described functionality.

Figure 1:
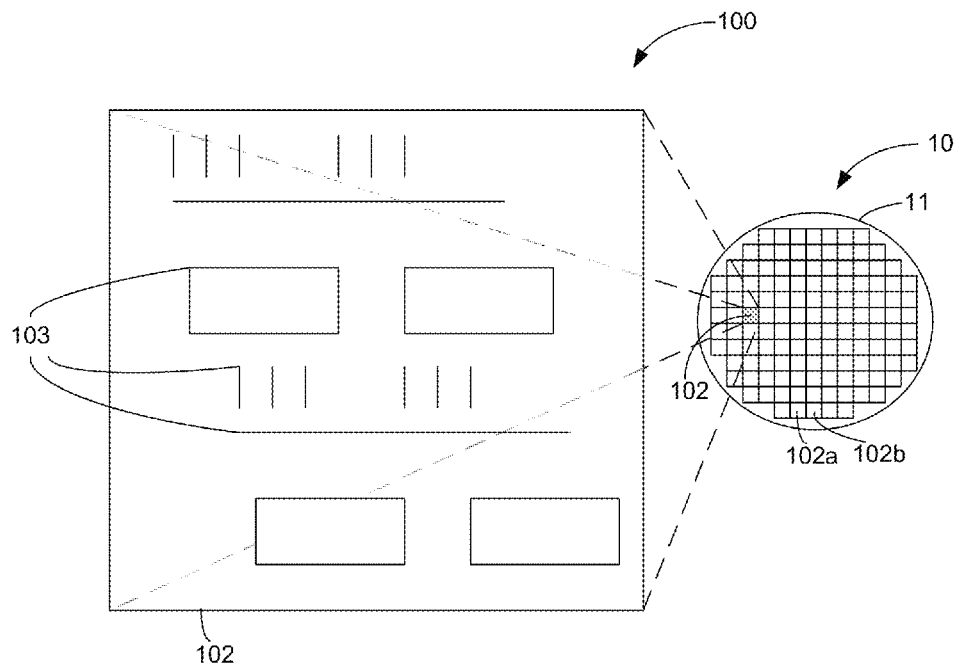
FIG. 1 schematically illustrates a top view of an example die in wafer form and in singulated form, in accordance with some embodiments.

FIG. 1 schematically illustrates a top view of an example die 102 in wafer form 10 and in singulated form 100, in accordance with some embodiments. In some embodiments, the die 102 may be one of a plurality of dies (e.g., dies 102, 102a, 102b) of a wafer 11 composed of semiconductor material such as, for example, silicon or other suitable material. The plurality of dies may be formed on a surface of the wafer 11. Each of the dies may be a repeating unit of a semiconductor product, that includes one or more modules configured to perform multi-pulse programming as described herein. For example, one or more modules of the die 102 may include circuitry 103 that is configured to perform multi-pulse programming. The one or more modules may be configured to perform read, program, verify and/or analysis operations as described herein. For example, the circuitry 103 may be configured to perform actions described in connection with FIG. 6 or elsewhere herein. In some embodiments, the circuitry 103 may be formed using complementary metal-oxide-silicon (CMOS) fabrication techniques and other suitable semiconductor fabrication techniques. It is noted that the circuitry 103 is only schematically depicted in FIG. 1 and may represent a wide variety of suitable logic in the form of circuitry including, for example, one or more state machines including circuitry and/or instructions in storage (e.g., firmware or software) configured to perform the actions of multi-pulse programming when executed.

After a fabrication process of the semiconductor product is complete, the wafer 11 may undergo a singulation process in which each of the dies (e.g., dies 102, 102a, 102b) is separated from one another to provide discrete "chips" of the semiconductor product. The wafer 11 may be any of a variety of sizes.

In some embodiments, the wafer 11 has a diameter ranging from about 25.4 mm to about 450 mm. The wafer 11 may include other sizes and/or other shapes in other embodiments. According to various embodiments, the circuitry 103 may be disposed on a semiconductor substrate in wafer form 10 or singulated form 100.

In some embodiments, the die 102 may represent MLC flash memory such as, for example, three dimensional (3D) NAND flash memory. The die 102 may include logic or memory, or combinations thereof. The die 102 may include other suitable dies configured to perform multi-pulse programming as described herein.

Figure 2:
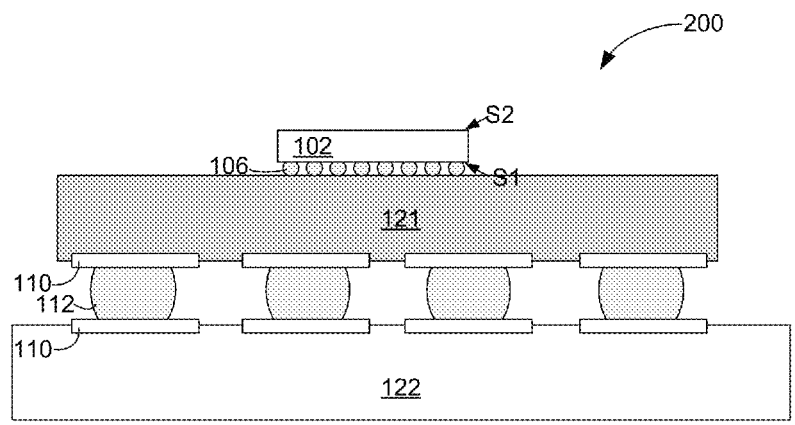
FIG. 2 schematically illustrates a cross-section side view of an integrated circuit (IC) assembly, in accordance with some embodiments.

FIG. 2 schematically illustrates a cross-section side view of an integrated circuit (IC) assembly 200, in accordance with some embodiments. In some embodiments, the IC assembly 200 may include one or more dies (hereinafter "die 102") electrically and/or physically coupled with a package substrate 121. The die 102 may include one or more modules (e.g., circuitry 103 of FIG. 1) configured to perform multi-pulse programming as described herein. In some embodiments, the package substrate 121 may be coupled with a circuit board 122, as can be seen.

The die 102 may represent a discrete product made from a semiconductor material (e.g., silicon) using semiconductor fabrication techniques such as thin film deposition, lithography, etching and the like used in connection with forming CMOS devices. In some embodiments, the die 102 may be, include, or be a part of a processor, memory, system-on-chip (SoC) or ASIC in some embodiments. In some embodiments, an electrically insulative material such as, for example, molding compound or underfill material (not shown) may encapsulate at least a portion of the die 102 and/or die-level interconnect structures 106.

The die 102 can be attached to the package substrate 121 according to a wide variety of suitable configurations including, for example, being directly coupled with the package substrate 121 in a flip-chip configuration, as depicted. In the flip-chip configuration, an active side, S1, of the die 102 including active circuitry is attached to a surface of the package substrate 121 using die-level interconnect structures 106 such as bumps, pillars, or other suitable structures that may also electrically couple the die 102 with the package substrate 121. The active side S1 of the die 102 may include circuitry such as, for example, transistor devices. An inactive side, S2, may be disposed opposite to the active side S1, as can be seen. In other embodiments, the die 102 may be disposed on another die that is coupled with the package substrate 121 in any of a variety of suitable stacked die configurations. For example, a processor die may be coupled with the package substrate 121 in a flip-chip configuration and the die 102 may be mounted on the processor die in a flip-chip configuration and electrically coupled with the package substrate using through-silicon vias (TSVs) formed through the processor die. In still other embodiments, the die 102 may be embedded in the package substrate 121 or coupled with a die that is embedded in the package substrate 121. Other dies may be coupled with the package substrate 121 in a side-by-side configuration with the die 102 in other embodiments.

In some embodiments, the die-level interconnect structures 106 may be configured to route electrical signals between the die 102 and the package substrate 121. The electrical signals may include, for example, input/output (I/O) signals and/or power/ground signals that are used in connection with operation of the die. The die-level interconnect structures 106 may be coupled with corresponding die contacts disposed on the active side S1 of the die 102 and corresponding package contacts disposed on the package substrate 121. The die contacts and/or package contacts may include, for example, pads, vias, trenches, traces and/or other suitable contact structures.

In some embodiments, the package substrate 121 is an epoxy-based laminate substrate having a core and/or build-up layers such as, for example, an Ajinomoto Build-up Film (ABF) substrate. The package substrate 121 may include other suitable types of substrates in other embodiments including, for example, substrates formed from glass, ceramic, or semiconductor materials.

The package substrate 121 may include electrical routing features configured to route electrical signals to or from the die 102. The electrical routing features may include, for example, package contacts (e.g., pads 110) disposed on one or more surfaces of the package substrate 121 and/or internal routing features (not shown) such as, for example, trenches, vias or other interconnect structures to route electrical signals through the package substrate 121.

The circuit board 122 may be a printed circuit board (PCB) composed of an electrically insulative material such as an epoxy laminate. For example, the circuit board 122 may include electrically insulating layers composed of materials such as, for example, polytetrafluoroethylene, phenolic cotton paper materials such as Flame Retardant 4 (FR-4), FR-1, cotton paper and epoxy materials such as CEM-1 or CEM-3, or woven glass materials that are laminated together using an epoxy resin prepreg material. Interconnect structures (not shown) such as traces, trenches, vias may be formed through the electrically insulating layers to route the electrical signals of the die 102 through the circuit board 122. The circuit board 122 may be composed of other suitable materials in other embodiments. In some embodiments, the circuit board 122 is a motherboard (e.g., motherboard 702 of FIG. 7).

Package-level interconnects such as, for example, solder balls 112 may be coupled to pads 110 on the package substrate 121 and/or on the circuit board 122 to form corresponding solder joints that are configured to further route the electrical signals between the package substrate 121 and the circuit board 122. The pads 110 may be composed of any suitable electrically conductive material such as metal including, for example, nickel (Ni), palladium (Pd), gold (Au), silver (Ag), copper (Cu), and combinations thereof. The package-level interconnect may include other structures and/or configurations including, for example, land-grid array (LGA) structures and the like.

The IC assembly 200 may include a wide variety of other suitable configurations in other embodiments including, for example, suitable combinations of flip-chip and/or wire-bonding configurations, interposers, multi-chip package configurations including system-in-package (SiP) and/or package-on-package (PoP) configurations. Other suitable techniques to route electrical signals between the die 102 and other components of the IC assembly 200 may be used in some embodiments.

Figure 3:
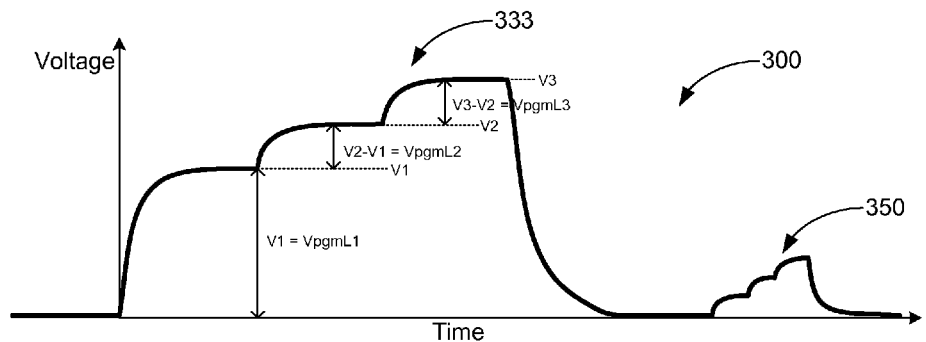
FIG. 3 schematically illustrates an example waveform of a selected wordline for program and verify operations, in accordance with some embodiments.

FIG. 3 schematically illustrates an example waveform 300 of a selected wordline for program and verify operations, in accordance with some embodiments. A voltage of the waveform 300 is schematically depicted on a vertical axis and a time of the waveform 300 is schematically depicted on a horizontal axis. The waveform 300 may represent a single programming loop of multiple programming loops according to various embodiments. In the single programming loop, a program operation may include multiple pulses applied to program one or more multi-level cells (hereinafter "MLCs") of a memory device.

In the program operation, individual pulses of the multiple pulses may correspond with individual levels of the MLCs, as can be seen in the program waveform 333. For example, a first pulse of the multiple pulses may have a first voltage, V1, to program a first level (L1) of the MLCs. The first voltage V1 may be a L1 program voltage ($V_{pgmL1}$) that changes a state of MLCs having an initial level (L0) (e.g., erased voltage level) to the first level L1. A second pulse of the multiple pulses may have a second voltage, V2, to program a second level (L2) of the MLCs. A L2 program voltage ($V_{pgmL2}$) that changes a state of MLCs from the first level L1 to the second level L2 may be equal to a difference between the second voltage V2 and the first voltage V1, as can be seen. A third pulse of the multiple pulses may have a third voltage, V3, to program a third level (L3) of the MLCs. A L3 program voltage ($V_{pgmL3}$) that changes a state of MLCs from the second level L2 to the third level L3 may be equal to a difference between the third voltage V3 and the second voltage V2, as can be seen. The third voltage V3 is greater than the second voltage V2, which is greater than the first voltage V1, as can be seen. Although the depicted program waveform 333 represents programming for 2-bit MLCs, similar principles may be used to program MLCs with more levels (e.g., 3-bit, 4-bit, etc.) than depicted in other embodiments.

In some embodiments, a voltage of a selected wordline to program the MLCs may be equal to or greater than the first voltage V1 during a transition time between the first pulse and the second pulse, as can be seen. In some embodiments voltage of a selected wordline to program the MLCs may be equal to or greater than the second voltage V2 during a transition time between the second pulse and the third pulse, as can be seen.

In some embodiments, the multiple pulses of a program operation may be applied in a different order to provide a program waveform different from the sequentially ramped up voltages (e.g., V1, V2 and V3) depicted in program waveform 333. For example, in some embodiments, the multiple pulses may be applied in a sequentially ramped down manner (e.g., V3 applied first, V2 applied second and V1 applied third). In other embodiments, the multiple pulses may be applied in a combination of ramped up and ramped down embodiments.

In some embodiments, the multiple pulses of a program operation may have more or fewer pulses than depicted in the figures. For example, in some embodiments, the number of pulses, p, in a single programming loop may vary from two to p, where p represents an integer greater than two. In some embodiments, p may include a value greater than ten. In some embodiments, multiple pulses of the program operation may be applied to program an individual level of the MLCs. In some embodiments, the multiple pulses of the program operation may be applied to program an individual level of the MLCs during a single programming loop. For example, in one embodiment, at least two of the multiple pulses may be applied to program an individual level of the individual levels.

In the single programming loop, a verify operation may be performed subsequent to performing the program operation. In the verify operation, multiple pulses corresponding with each of the individual levels of the MLCs may be applied to verify programming of the respective voltages of the first level L1, the second level L2 and the third level L3, as can be seen in the verify waveform 350. For example, a first pulse of the verify operation may be followed by a second pulse and a third pulse in succession where the first pulse is configured to verify the first level L1, the second pulse is configured to verify the second level L2 and the third pulse is configured to verify the third level of the program operation. Each of the multiple pulses of the verify operation may have a verify voltage that corresponds with the respective program voltages (e.g., $V_{pgmL1}$, $V_{pgmL2}$, $V_{pgmL3}$) of the levels L1, L2 and L3. For example, in some embodiments, a relationship between the voltages of the multiple pulses of the verify operation and corresponding pulses of the program operation may be linear.

Figure 4:
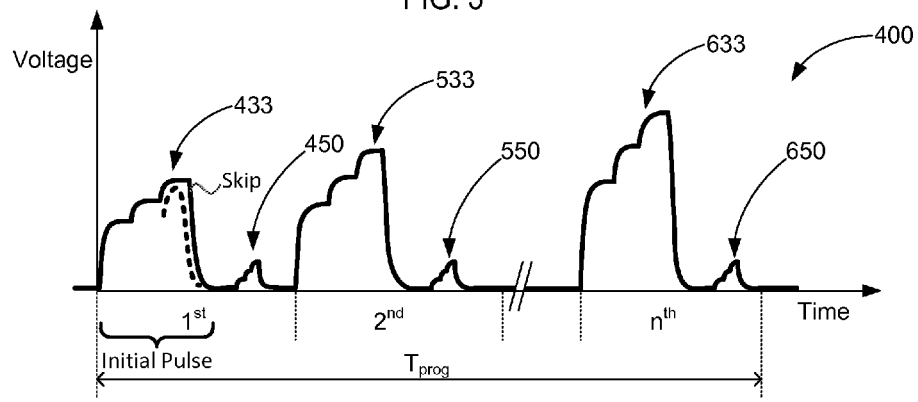
FIG. 4 schematically illustrates an example waveform of a selected wordline for multiple program and verify operations corresponding with multiple programming loops of an example program cycle, in accordance with some embodiments.

FIG. 4 schematically illustrates an example waveform 400 of a selected wordline for multiple program and verify operations corresponding with multiple programming loops of an example program cycle, in accordance with some embodiments. For example, a $1^{st}$ programming loop may include a program operation of multiple pulses as represented by program waveform 433 and a verify operation of multiple pulses as represented by verify waveform 450, a $2^{nd}$ programming loop may include a program operation of multiple pulses as represented by program waveform 533 and a verify operation of multiple pulses as represented by verify waveform 550, and so forth to a final $n^{th}$ programming loop of a program cycle, which includes a program operation of multiple pulses as represented by program waveform 633 and a verify operation of multiples pulses as represented by verify waveform 650. The value n may represent any suitable number of programming loops according to various embodiments. According to various embodiments, features of any or each of the programming loops (e.g., $1^{st}$, $2^{nd}$, ... $n^{th}$) may comport with embodiments described in connection with analogous features of the single programming loop of FIG. 3.

According to various embodiments, an individual programming loop may include the actions of applying the multiple pulses and verifying the programming of the individual levels of the MLCs. The actions of the individual programming loop may be iteratively performed until the program cycle is complete (e.g., the individual levels of the MLCs have reached a target voltage). In some embodiments, each level (e.g., L1, L2, L3) of the MLCs may receive only one corresponding pulse of the multiple programming pulses during a single programming loop. When all of the MLCs of a program cycle have reached a target voltage in a level (e.g., L1, L2, L3), such level may not receive a programming pulse in subsequent programming loops of the program cycle. In some embodiments, individual pulses of the multiple programming pulses may be applied only to bitlines corresponding with individual levels (e.g., L1, L2, L3) of the one or more MLCs that have not reached a target voltage.

In some embodiments, the individual programming loop may further include the action of, subsequent to performing a verify operation, increasing a wordline voltage for applying multiple programming pulses in a subsequent programming loop. For example, as can be seen, a voltage of a program operation (e.g., program waveform 533) of the $2^{nd}$ programming loop may be greater than a voltage of a program operation (e.g., program waveform 433) of the $1^{st}$ programming loop, and so forth to the $n^{th}$ programming loop, which may include a voltage of a program operation (e.g., program waveform 633) that is greater than voltages of preceding program operations of the program cycle.

According to various embodiments, a lower level (e.g., L1) may be inhibited during programming of a higher level (e.g., L3). For example, a lower level (e.g., L1) channel may boost to a higher potential than a potential (e.g., ground) used during programming of the lower level. In some embodiments, such inhibiting of the lower level may be achieved by increasing a supply voltage of a bitline corresponding with L1 during application of a second pulse (e.g., V2 of FIG. 3) and/or the third pulse (e.g., V3 of FIG. 3). Such inhibiting of the lower level may be achieved by increasing a supply voltage of a bitline corresponding with L2 during application of the third pulse (e.g., V3 of FIG. 3) in another embodiment. In some embodiments, L1 may be inhibited during pulses to program L2 and L3 and L2 may be inhibited during a pulse to program L3. Boosting of the lower level channel by increasing a voltage of bitlines corresponding with the levels L1, L2, L3 is further depicted and described in connection with FIG. 5.

In some embodiments, the boost/inhibition of the lower channel may be alleviated by reducing or minimizing a program voltage of the multiple programming pulses (e.g., between L1 and L3 pulses). For example, in some embodiments, during an initial phase of the program cycle, the pulses corresponding with L1 and L2 may be applied and the pulse corresponding with L3 may not be applied for one or more of the programming loops. Skipping L3 pulses during one or more of the initial programming loops may bound a maximum programming voltage seen by L1 to a voltage that may otherwise be higher.

A programming time, $T_{prog}$, may represent a total time to program the MLCs in a program cycle, as can be seen. Embodiments of the present disclosure may reduce a programming time $T_{prog}$ in a memory device. For example, iterative application of multiple pulses to program the MLCs in individual programming loops of the multiple programming loops may provide ~15% reduction in $T_{prog}$ relative to iterative application of a single pulse to program the MLCs in individual programming loops of the multiple programming loops. Although the multiple programming pulses may increase a duration of an individual programming loop (e.g., ~30% increase in individual loop duration), application of the multiple programming pulses may reduce a number, n, of programming loops to complete programming (e.g., ~45% reduction of programming loops) of the MLCs resulting in a net benefit reduction in $T_{prog}$.

Figure 5:
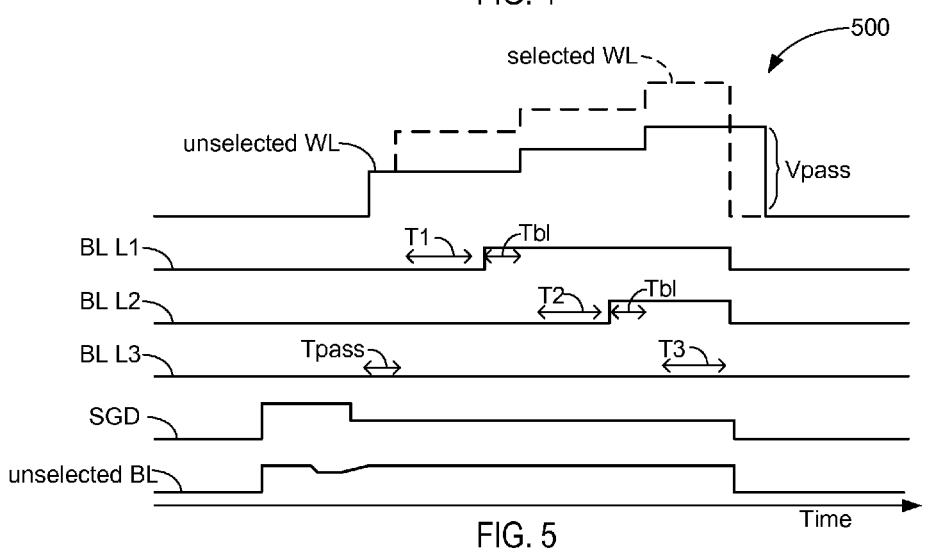
FIG. 5 schematically illustrates example waveforms of various memory components during a single multi-pulse program operation, in accordance with some embodiments.

FIG. 5 schematically illustrates example waveforms 500 of various memory components during a single multi-pulse program operation, in accordance with some embodiments. For example, the example waveforms 500 include a waveform of a selected wordline (WL) for applying multiple programming pulses to program levels of the MLCs in a single program operation and waveforms of an unselected WL, a bitline (BL L1) corresponding with a first level of the MLCs, a bitline (BL L2) corresponding with a second level of the MLCs, a bitline (BL L3) corresponding with a third level of the MLCs, a select gate drain (SGD) and an unselected bitline (BL) relative to the selected WL.

A voltage of the selected WL may be ramped to a first voltage (e.g., V1 of FIG. 3), a second voltage (e.g., V2 of FIG. 3) and a third voltage (e.g., V3 of FIG. 3) to program corresponding levels (e.g., L1, L2, L3) of MLCs under selection by the selected WL, as can be seen. A voltage of the unselected WL may be ramped to voltages that may be lower than the corresponding programming voltages of the selected WL and/or may overlap slightly differently in time, as can be seen. For example, the voltage of the unselected WL may be ramped prior to the selected WL to provide a time (e.g., Tpass) to charge the unselected WL. In some embodiments, voltages for the selected WL and unselected WL may ramp together and remain relatively high, as can be seen, which may facilitate charging of the WLs up to a desired voltage and provide an additional performance improvement for the memory device, in particular for a memory device having a relatively higher WL capacitance. A voltage (Vpass) of the unselected WL may be a target voltage configured to boost a channel of the unselected BL to reduce a likelihood or prevent unintentional programming of the unselected BL.

Times T1, T2 and T3 may represent a time to charge the selected WL for each of the programming pulses corresponding with levels L1, L2 and L3 of the MLCs. As previously described in connection with FIG. 4, a voltage of the BL L1 and BL L2 may be increased during application of the programming pulses, as can be seen, to inhibit L1 during programming of L2 and L3 and to inhibit L2 during programming of L3, as can be seen.

The SGD may select a block of the memory device for programming. A voltage of the SGD and the unselected BL is depicted relative to the other described voltages to provide one example embodiment. Other suitable voltage waveforms than depicted in the waveforms 500 may be used in other embodiments.

Figure 6:
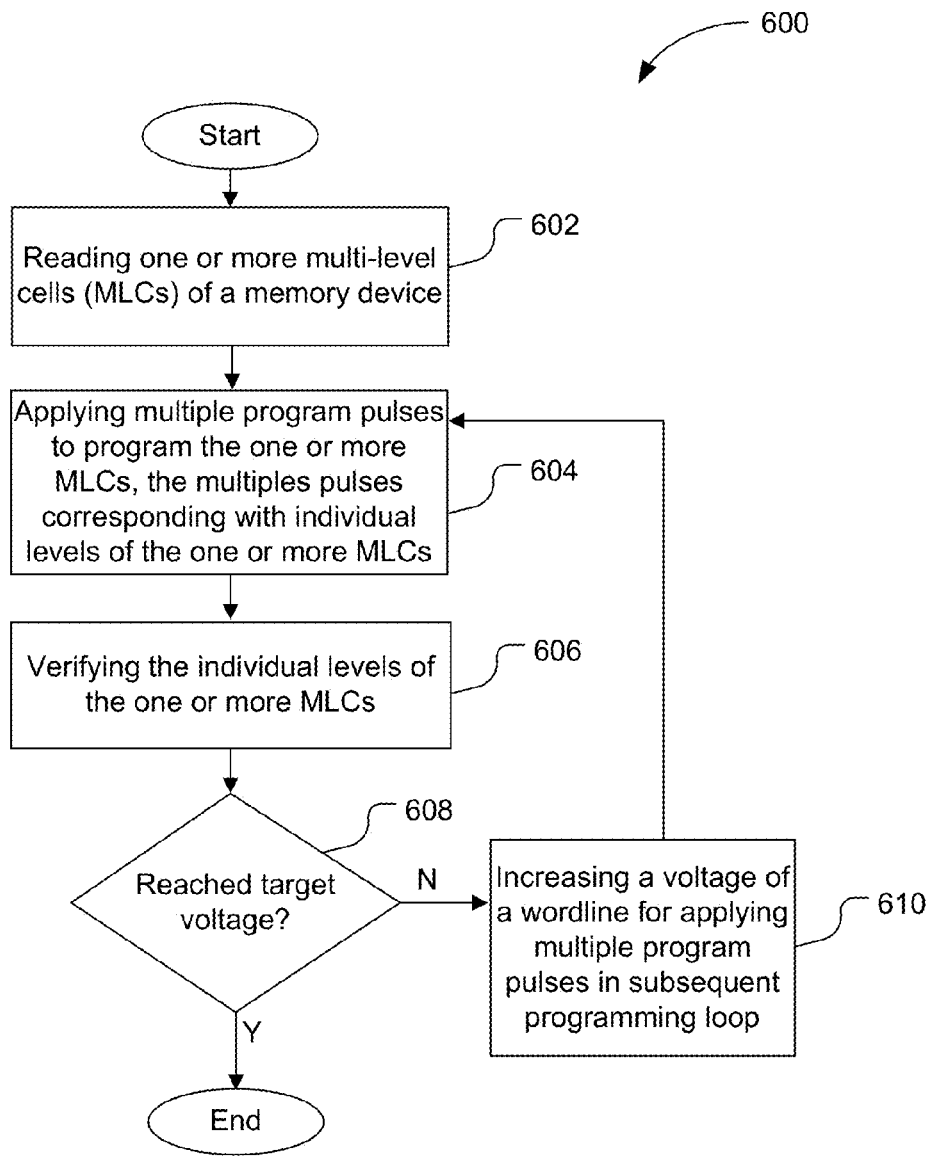
FIG. 6 is a flow diagram of a method for performing multi-pulse programming, in accordance with some embodiments.

FIG. 6 is a flow diagram of a method 600 for performing multi-pulse programming, in accordance with some embodiments. The method 600 may comport with embodiments described in connection with FIGS. 1-5 and vice versa. In some embodiments, one or more actions of the method 600 may be performed by logic such as one or more state machines based on input from logic elements such as, for example, circuitry (e.g., circuitry 103) disposed on a die (e.g., die 102 of FIG. 1) and the logic or logical element may be in the form of firmware, a dynamic data cache (DDC) or any other suitable element.

At 602, the method 600 may include reading one or more multi-level cells (MLCs) of a memory device. The one or more MLCs may be read to measure a voltage of individual levels of the one or more MLCs. In some embodiments, reading the one or more MLCs at 602 comprises reading lower page data (e.g., lower-bit data). For example, in an individual 2-bit multi-level cell (MLC), 2-bits of data may be stored in a wordline and may be referred to as a lower-bit and upper-bit. During programming of the upper-bit, the corresponding cell may be programmed to one of 4 voltage distributions based on a combination of upper-bit data (e.g., customer data) and lower-bit data (cells that have already been programmed). The one or more MLCs that are read at 602 may be selected for programming according to any suitable technique or criteria and may be read based on being selected for programming. A target voltage (e.g., target voltage of 608) for programming of the one or more MLCs may be identified based on reading the one or more MLCs at 602. The target voltage may correspond with a threshold voltage (Vt) of the individual levels of the one or more MLCs, according to various embodiments.

At 604, the method 600 may include applying multiple program pulses to program the one or more MLCs, the multiple pulses corresponding with individual levels of the one or more MLCs. For example, the multiple program pulses may correspond with voltages V1, V2 and V3 as depicted in the program waveform 333 of FIG. 3. In some embodiments, applying the multiple pulses at 604 may include applying the individual pulses of the multiple pulses only to bitlines corresponding with the individual levels of the one or more MLCs that have not reached a target voltage. For example, a program pulse may be applied to only L1 bitlines (e.g., BL L1 of FIG. 5) that have not reached a target voltage, followed by a program pulse that may be applied to only L2 bitlines (e.g., BL L2 of FIG. 5) that have not reached a target voltage, followed by a program pulse that may be applied to only L3 bitlines (e.g., BL L3 of FIG. 5) that have not reached a target voltage.

At 606, the method 600 may include verifying the individual levels of the one or more MLCs. In some embodiments, verifying the programming of the individual levels includes reading a voltage of the individual levels. The verifying may comport with embodiments described in connection with verify waveform 350 of FIG. 3. For example, in some embodiments, verifying at 606 may include verifying L1 programming, followed by verifying L2 programming, followed by verifying L3 programming.

At 608, the method 600 may include determining whether the one or more MLCs have reached the target voltage. For example, determining may include analysis such as, for example, comparing the voltage of the individual levels read during verifying at 606 with the target voltage of the individual levels. If any of the one or more MLCs have not reached the target voltage, then the method 600 may proceed to action 610. If all of the one or more MLCs have reached the target voltage, the program cycle may end.

At 610, the method 600 may include increasing a voltage of a wordline for applying multiple program pulses in a subsequent programming loop. For example, a voltage of the selected WL of FIG. 5 may be increased for each subsequent programming loop to increase a programming voltage in each subsequent programming loop (e.g., as depicted in program waveforms 433, 533, 633 of FIG. 4).

Actions described at 604 may be performed subsequent to actions at 610. Actions at 604, 606, 608 and/or 610 may be actions of a single programming loop. The actions may be iteratively performed multiple times to provide actions of multiple programming loops of a program cycle, which may end when the one or more MLCs have reached the target voltage. In some embodiments, reading the one or more MLCs at 602 may be performed prior to an initial programming loop of the program cycle. In some embodiments, one or more of the MLCs may be selected for further programming based on a determination that individual levels of the one or more of the MLCs have not reached a target voltage of the individual levels (e.g., determination at 608). The selecting may be performed by selecting a wordline and/or bitline corresponding with the one or more of the MLCs.

Figure 7:
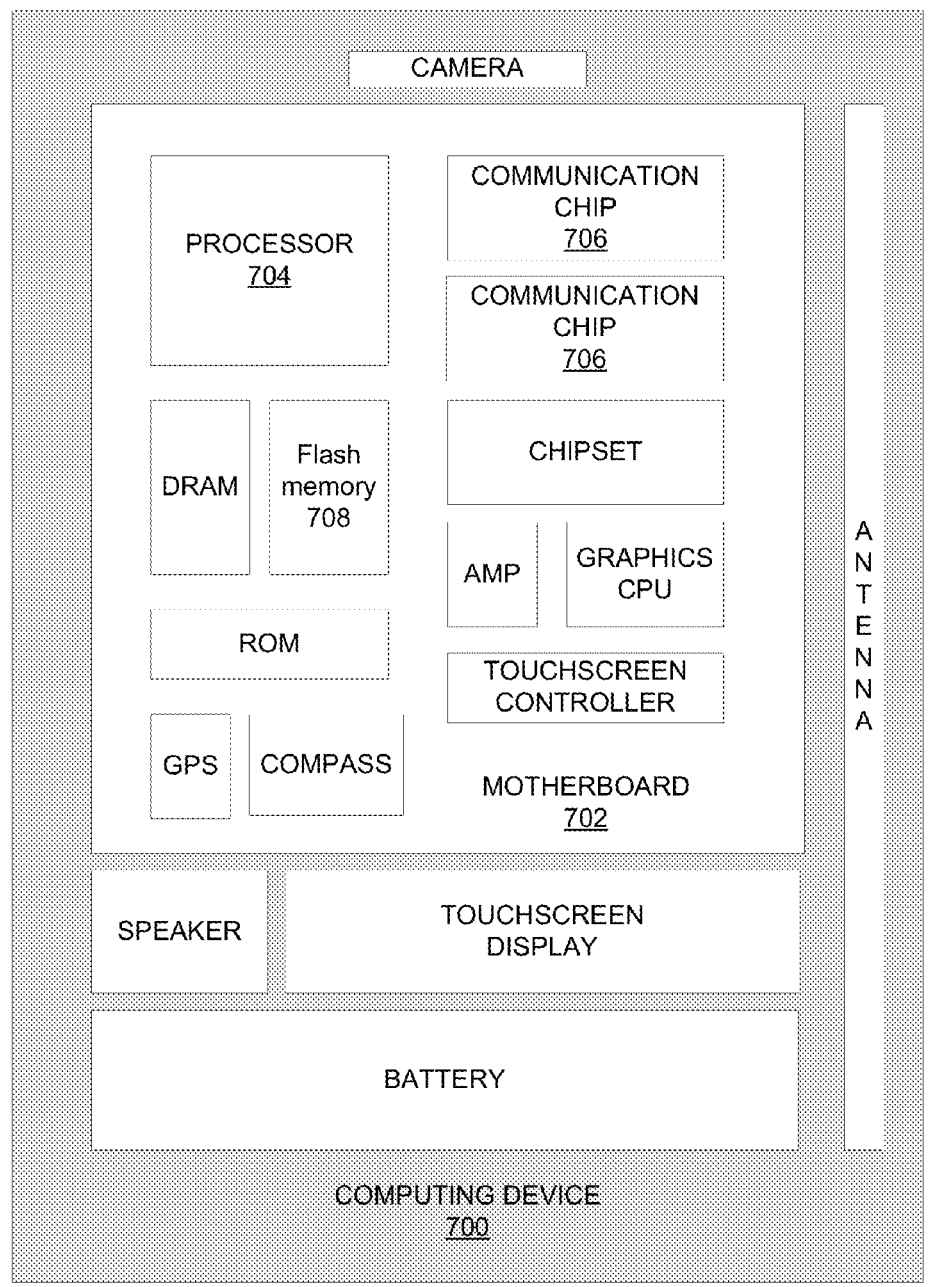
FIG. 7 schematically illustrates an example system that may include memory configured to perform multi-pulse programming as described herein, in accordance with some embodiments.

Embodiments of the present disclosure may be implemented into a system using any suitable hardware and/or software to configure as desired. FIG. 7 schematically illustrates an example system 700 that may include memory (e.g., flash memory 708 of FIG. 7) configured to perform multi-pulse programming as described herein, in accordance with some embodiments. The computing device 700 may house a board such as motherboard 702. The motherboard 702 may include a number of components, including but not limited to a processor 704 and at least one communication chip 706. The processor 704 may be physically and electrically coupled to the motherboard 702. The term "processor" may refer to any device or portion of a device that processes electronic data from registers and/or memory to transform that electronic data into other electronic data that may be stored in registers and/or memory. In some implementations, the at least one communication chip 706 may also be physically and electrically coupled to the motherboard 702. In further implementations, the communication chip 706 may be part of the processor 704. In some embodiments, the computing device 700 includes flash memory 708 physically and electrically coupled to the motherboard 702.

The flash memory 708 of the computing device 700 may be packaged in an IC assembly (e.g., IC assembly 200 of FIG. 2) that includes the flash memory 708 configured to perform multi-pulse programming as described herein, in accordance with some embodiments. For example, the circuit board 122 of FIG. 2 may be a motherboard 702 and the flash memory 708 may be embodied in a die 102 mounted on a package substrate 121 as depicted in FIG. 1. The package substrate 121 and the motherboard 702 may be coupled together using package-level interconnects. In other embodiments, another memory device of the computing device 700 may be configured to perform multi-pulse programming as described herein, in accordance with some embodiments. In some embodiments, the flash memory 708 may be integrated and/or otherwise combined with the processor 704, the communication chip 706 or another die of the computing device 700.

Depending on its applications, computing device 700 may include other components that may or may not be physically and electrically coupled to the motherboard 702. These other components may include, but are not limited to, volatile memory (e.g., DRAM), non-volatile memory (e.g., ROM or flash memory), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as hard disk drive, compact disk (CD), digital versatile disk (DVD), and so forth).

The communication chip 706 may enable wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible BWA networks are generally referred to as WiMAX networks, an acronym that stands for Worldwide Interoperability for Microwave Access, which is a certification mark for products that pass conformity and interoperability tests for the IEEE 802.16 standards. The communication chip 706 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 706 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 706 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 706 may operate in accordance with other wireless protocols in other embodiments.

The computing device 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev-DO, and others.

In various implementations, the computing device 700 may be mobile computing device, a laptop, a netbook, a notebook, an ultrabook, a smart phone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 700 may be any other electronic device that processes data.

EXAMPLES

According to various embodiments, the present disclosure described a method for multi-pulse programming. Example 1 of the method includes applying multiple pulses to program one or more multi-level cells (MLCs) of a memory device, wherein individual pulses of the multiple pulses correspond with individual levels of the one or more MLCs and subsequent to said applying the multiple pulses, verifying the programming of the individual levels of the one or more MLCs. Example 2 includes the method of Example 1, wherein a single programming loop includes the actions of said applying the multiple pulses and said verifying the programming, and the method further includes iteratively performing the actions of the single programming loop until the one or more MLCs have reached a target voltage. Example 3 includes the method of Example 2, wherein said applying the multiple pulses comprises applying the individual pulses of the multiple pulses only to bitlines corresponding with the individual levels of the one or more MLCs that have not reached the target voltage and the single programming loop further includes, subsequent to said verifying the programming, increasing a wordline voltage for applying multiple pulses in a subsequent programming loop. Example 4 includes the method of Example 2, wherein the single programming loop is an initial programming loop of multiple programming loops, the method further comprising prior to performing actions of the initial programming loop, reading lower page data of the one or more MLCs. Example 5 includes the method of any of Examples 2-4, the method further including subsequent to verifying the multiple pulses, determining whether the one or more MLCs have reached the target voltage. Example 6 includes the method of Example 5, the method further including selecting one or more of the MLCs for further programming based on a determination that the one or more of the MLCs have not reached the target voltage wherein said verifying the programming includes reading a voltage of the individual levels, said determining comprises comparing the voltage of the individual levels with a target voltage of the individual levels and said selecting is performed by selecting a wordline corresponding with the one or more of the MLCs. Example 7 includes the method of any of Examples 1-4, wherein said applying the multiple pulses is performed to program an individual multi-level cell (MLC) of the one or more MLCs. Example 8 includes the method of any of Examples 1-4, wherein a first pulse of the multiple pulses has a first voltage to program a first level (L1) of the one or more MLCs, a second pulse of the multiple pulses has a second voltage to program a second level (L2) of the one or more MLCs, a third pulse of the multiple pulses has a third voltage to program a third level (L3) of the one or more MLCs, the second voltage is greater than the first voltage and the third voltage is greater than the second voltage. Example 9 includes the method of Example 8, wherein a voltage of a selected wordline corresponding with the one or more MLCs is equal to or greater than the first voltage during a transition between the first pulse and the second pulse and a voltage of the selected wordline corresponding with the one or more MLCs is equal to or greater than the second voltage during a transition between the second pulse and the third pulse. Example 10 includes the method of Example 8, wherein a difference between the second voltage and the first voltage corresponds with a voltage of a verify operation of the second level of the one or more MLCs and a difference between the third voltage and the second voltage corresponds with a voltage of a verify operation of the third level of the one or more MLCs. Example 11 includes the method of Example 8, the method further including increasing a voltage of a bitline corresponding with the first level during application of the second pulse and the third pulse relative to a voltage of the bitline during application of the first pulse and increasing a voltage of a bitline corresponding with the second level during application of the third pulse relative to a voltage of the bitline corresponding with the second level during application of the second pulse. Example 12 includes the method of Example 8, wherein said applying the multiple pulses is performed only for the first pulse and the second pulse and not the third pulse.

According to various embodiments, the present disclosure further describes an apparatus (e.g., a die) comprising means (e.g., one or more modules and/or circuitry) for performing multi-pulse programming. Example 13 includes an apparatus comprising means for applying multiple pulses to program one or more multi-level cells (MLCs) of a memory device, wherein individual pulses of the multiple pulses correspond with individual levels of the one or more MLCs and means for, subsequent to said applying the multiple pulses, verifying the programming of the individual levels of the one or more MLCs. Example 14 includes the apparatus of Example 13, wherein a single programming loop includes the actions of said applying the multiple pulses and said verifying the programming, the apparatus further comprising means for iteratively performing the actions of the single programming loop until the one or more MLCs have reached a target voltage. Example 15 includes the apparatus of any of Examples 13-14, wherein a first pulse of the multiple pulses has a first voltage to program a first level (L1) of the one or more MLCs, a second pulse of the multiple pulses has a second voltage to program a second level (L2) of the one or more MLCs, a third pulse of the multiple pulses has a third voltage to program a third level (L3) of the one or more MLCs, the second voltage is greater than the first voltage and the third voltage is greater than the second voltage. The apparatus may be further include means configured to perform other actions of the method described in the examples above.

According to various embodiments, the present disclosure further describes one or more computer-readable storage media having instructions stored thereon that, when executed by one or more processors, cause a device to perform multi-pulse programming. Example 17 includes one or more computer-readable storage media having instructions stored thereon that, when executed by one or more processors, cause a device to perform applying multiple pulses to program one or more multi-level cells (MLCs) of a memory device, wherein individual pulses of the multiple pulses correspond with individual levels of the one or more MLCs and subsequent to said applying the multiple pulses, verifying the programming of the individual levels of the one or more MLCs. Example 18 includes the one or more computer-readable storage media of Example 17, wherein a single programming loop includes the actions of said applying the multiple pulses and said verifying the programming and wherein the instructions, when executed by the one or more processors further cause the device to iteratively perform the actions of the single programming loop until the one or more MLCs have reached a target voltage. Example 18 includes the one or more computer-readable storage media of any of Examples 16-17, wherein a first pulse of the multiple pulses has a first voltage to program a first level (L1) of the one or more MLCs a second pulse of the multiple pulses has a second voltage to program a second level (L2) of the one or more MLCs, a third pulse of the multiple pulses has a third voltage to program a third level (L3) of the one or more MLCs, the second voltage is greater than the first voltage and the third voltage is greater than the second voltage.

According to various embodiments, the present disclosure further describes a computing device configured to perform multi-pulse programming of a memory device. Example 19 includes a computing device including a circuit board and flash memory coupled with the circuit board and configured to apply multiple pulses to program one or more multi-level cells (MLCs) of the flash memory, wherein individual pulses of the multiple pulses correspond with individual levels of the one or more MLCs and subsequent to said applying the multiple pulses, verifying the programming of the individual levels of the one or more MLCs. Example 20 includes the computing device of Example 19, wherein a single programming loop includes the actions of said applying the multiple pulses and said verifying the programming, the flash memory is further configured to iteratively perform the actions of the single programming loop until the one or more MLCs have reached a target voltage, and the computing device is a mobile computing device including one or more of an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, or a camera coupled with the circuit board. The flash memory of the computing device may be configured to perform other actions described in connection with the method in the example above. Various embodiments may include any suitable combination of the above-described embodiments including alternative (or) embodiments of embodiments that are described in conjunctive form (and) above (e.g., the "and" may be "and/or").

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. A method comprising:
    iteratively performing multiple programming loops to program one or more multi-level cells (MLCs) of a memory device to respective target voltages, wherein a programming loop comprises:
    applying multiple pulses to program the one or more MLCs of the memory device, wherein individual pulses of the multiple pulses correspond with individual levels of the one or more MLCs; and
    subsequent to said applying the multiple pulses, verifying the programming of the individual levels of the one or more MLCs;
    wherein the method further comprises in one or more initial programming loops of the multiple programming loops, skipping a pulse of the multiple pulses with an amplitude that is greater than amplitudes of other pulses of the multiple pulses, to reduce a program voltage of the multiple programming pulses.

2. The method of claim 1, wherein:
    said applying the multiple pulses comprises applying the individual pulses of the multiple pulses only to bitlines corresponding with the individual levels of the one or more MLCs that have not reached the target voltage; and
    the programming loop further includes, subsequent to said verifying the programming, increasing a wordline voltage for applying multiple pulses in a subsequent programming loop.

3. The method of claim 1, wherein the programming loop is an initial programming loop of multiple programming loops, the method further comprising:
    prior to performing actions of the initial programming loop, reading lower page data of the one or more MLCs.

4. The method of claim 1, further comprising:
    subsequent to verifying the multiple pulses, determining whether the one or more MLCs have reached the target voltage.

5. The method of claim 4, further comprising:
    selecting one or more of the MLCs for further programming based on a determination that the one or more of the MLCs have not reached the target voltage;
    wherein:
    said verifying the programming includes reading a voltage of the individual levels;
    said determining comprises comparing the voltage of the individual levels with a target voltage of the individual levels; and
    said selecting is performed by selecting a wordline corresponding with the one or more of the MLCs.

6. The method of claim 1, wherein said applying the multiple pulses includes applying at least two pulses to program an individual level of the individual levels.

7. The method of claim 1, wherein:
    a first pulse of the multiple pulses has a first voltage to program a first level (L1) of the one or more MLCs;
    a second pulse of the multiple pulses has a second voltage to program a second level (L2) of the one or more MLCs;
    a third pulse of the multiple pulses has a third voltage to program a third level (L3) of the one or more MLCs;
    the second voltage is greater than the first voltage; and
    the third voltage is greater than the second voltage.

8. The method of claim 7, wherein:
    a voltage of a selected wordline corresponding with the one or more MLCs is equal to or greater than the first voltage during a transition time between the first pulse and the second pulse; and
    a voltage of the selected wordline corresponding with the one or more MLCs is equal to or greater than the second voltage during a transition time between the second pulse and the third pulse.

9. The method of claim 7, wherein:
    a difference between the second voltage and the first voltage corresponds with a voltage of a verify operation of the second level of the one or more MLCs; and
    a difference between the third voltage and the second voltage corresponds with a voltage of a verify operation of the third level of the one or more MLCs.

10. The method of claim 7, further comprising:
increasing a voltage of a bitline corresponding with the first level during application of the second pulse and the third pulse relative to a voltage of the bitline during application of the first pulse; and
increasing a voltage of a bitline corresponding with the second level during application of the third pulse relative to a voltage of the bitline corresponding with the second level during application of the second pulse.

11. An apparatus comprising:
means for iteratively performing multiple programming loops to program one or more multi-level cells (MLCs) of a memory device to respective target voltages, wherein the means includes for each programming loop:
means for applying multiple pulses to program the one or more MLCs of the memory device, wherein individual pulses of the multiple pulses correspond with individual levels of the one or more MLCs; and
means for, subsequent to said applying the multiple pulses, verifying the programming of the individual levels of the one or more MLCs,
wherein the means for iteratively performing further includes means for skipping a pulse of the multiple pulses with an amplitude that is greater than amplitudes of other pulses of the multiple pulses, in one or more initial programming loops of the multiple programming loops, to reduce a program voltage of the multiple programming pulses.

12. The apparatus of claim 11, wherein:
a first pulse of the multiple pulses has a first voltage to program a first level (L1) of the one or more MLCs;
a second pulse of the multiple pulses has a second voltage to program a second level (L2) of the one or more MLCs;
a third pulse of the multiple pulses has a third voltage to program a third level (L3) of the one or more MLCs;
the second voltage is greater than the first voltage; and
the third voltage is greater than the second voltage.

13. One or more non-transitory computer-readable storage media having instructions stored thereon that, when executed by one or more processors, cause a device to perform multi-pulse programming by:
iteratively performing multiple programming loops to program one or more multi-level cells (MLCs) of a memory device to respective target voltages, wherein each programming loop comprises:
applying multiple pulses to program one or more multi-level cells (MLCs) of a memory device, wherein individual pulses of the multiple pulses correspond with individual levels of the one or more MLCs; and
subsequent to said applying the multiple pulses, verifying the programming of the individual levels of the one or more MLCs,
wherein iteratively performing includes, in one or more initial programming loops of the multiple programming loops, skipping a pulse of the multiple pulses with an amplitude that is greater than amplitudes of other pulses of the multiple pulses, to reduce a program voltage of the multiple programming pulses.

14. The one or more non-transitory computer-readable storage media of claim 13, wherein:
a first pulse of the multiple pulses has a first voltage to program a first level (L1) of the one or more MLCs;
a second pulse of the multiple pulses has a second voltage to program a second level (L2) of the one or more MLCs;
a third pulse of the multiple pulses has a third voltage to program a third level (L3) of the one or more MLCs;
the second voltage is greater than the first voltage; and
the third voltage is greater than the second voltage.

15. A computing device, comprising:
a circuit board; and
flash memory coupled with the circuit board and configured to iteratively perform multiple programming loops to program one or more multi-level cells (MLCs) of a memory device to respective target voltages, wherein to program each programming loop comprises:
apply multiple pulses to program one or more multi-level cells (MLCs) of the flash memory, wherein individual pulses of the multiple pulses correspond with individual levels of the one or more MLCs; and
subsequent to said application of the multiple pulses, verify the programming of the individual levels of the one or more MLCs,
wherein iteratively perform includes, in one or more initial programming loops of the multiple programming loops, to skip a pulse of the multiple pulses with an amplitude that is greater than amplitudes of other pulses of the multiple pulses, to reduce a program voltage of the multiple programming pulses.

16. The computing device of claim 15, wherein
the computing device is a mobile computing device including one or more of an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, or a camera coupled with the circuit board.

* * * * *